US012317755B2

(12) United States Patent
Beck et al.

(10) Patent No.: US 12,317,755 B2
(45) Date of Patent: May 27, 2025

(54) QUANTUM CIRCUIT WITH JOSEPHSON MULTIPOLE ISOLATOR

(71) Applicant: International Business Machines Corporation, Armonk, NY (US)

(72) Inventors: Matthew Beck, Danbury, CT (US); Michael Karunendra Selvanayagam, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 740 days.

(21) Appl. No.: 17/505,358

(22) Filed: Oct. 19, 2021

(65) Prior Publication Data
US 2023/0119964 A1    Apr. 20, 2023

(51) Int. Cl.
*H01L 39/22*    (2006.01)
*G01R 33/035*   (2006.01)
(Continued)

(52) U.S. Cl.
CPC ......... *H10N 60/12* (2023.02); *G01R 33/0354* (2013.01); *G06N 10/00* (2019.01)

(58) Field of Classification Search
CPC .... H10N 60/12; G01R 33/0354; G06N 10/00; G06N 10/40
See application file for complete search history.

(56) References Cited

U.S. PATENT DOCUMENTS 11,983,602 B1 * 5/2024 Field ................. G06F 1/324
2020/0320426 A1   10/2020 Amin et al.
(Continued)

FOREIGN PATENT DOCUMENTS

| CN | 111931940 A   | 11/2020 |
| JP | 2011129594 A  | 6/2011  |
| WO | 2020105732 A1 | 5/2020  |

OTHER PUBLICATIONS

International Search Report and Written Opinion received for PCT Application Serial No. PCT/EP2022/078445 dated Feb. 17, 2023, 12 pages.
(Continued)

*Primary Examiner* — Mohammed R Alam
(74) *Attorney, Agent, or Firm* — Amin, Turocy & Watson, LLP

(57) ABSTRACT

One or more systems, devices, methods of use and/or methods of fabrication provided herein relate to a device that can facilitate qubit measurement with isolation imposed between a quantum processor and a respective qubit measurement circuit and/or which respective qubit measurement circuit can have a small footprint, such as within a respective cryogenic chamber of a quantum system. According to one embodiment, a device comprises an isolator circuit having a bandpass filter configuration coupled between a pair of ports and the bandpass filter configuration comprising two or more poles. Two or more shunt resonators can be realized as the two or more poles, wherein the two or more shunt resonators can comprise DC SQUIDs and can be coupled together with one or more admittance inverters. A non-reciprocal signal transmission can be generated between the two ports by RF pumping the DC SQUIDs.

8 Claims, 10 Drawing Sheets
(4 of 10 Drawing Sheet(s) Filed in Color)

(51) Int. Cl.
*G06N 10/00* (2022.01)
*H10N 60/12* (2023.01)

(56) References Cited

U.S. PATENT DOCUMENTS

| | | |
|---|---|---|
| 2020/0333263 A1 | 10/2020 | Abdo |
| 2021/0209498 A1 | 7/2021 | Jin et al. |
| 2022/0263483 A1* | 8/2022 | Koh .......................... H03F 7/04 |
| 2023/0006626 A1* | 1/2023 | Naaman ................. G06N 10/00 |

OTHER PUBLICATIONS

Naaman et al., "Synthesis of Parametrically-Coupled Networks", Arxiv:2109.11628v4, Apr. 27, 2022, 37 pages.

Potočnik et al., "Millikelvin Temperature Cryo-CMOS Multiplexer for Scalable Quantum Device Characterisation", Arxiv.Org, Cornell University Library, Nov. 23, 2020, 36 pages.

Mell et al., "The NIST Definition of Cloud Computing," Recommendations of the National Institute of Standards and Technology, NIST Special Publication 800-145, Sep. 2011, 7 pages.

Sadeghi et al., "Crosstalk Suppression and High-Fidelity Measurement in 2D Tunneling of Coupled Josephson Junctions," IEEE Transactions on Applied Superconductivity 22.4 (2012): 1700110-1700110, 10 pages.

Wu et al., "Isolating Bandpass Filters Using Time-Modulated Resonators," IEEE Transactions on Microwave Theory and Techniques, vol. 67, No. 6, Jun. 2019, 15 pages.

Estep et al., "Magnetic-free non-reciprocity and isolation based on parametrically modulated coupled-resonator loops," Nature Physics, vol. 10. Dec. 2014, 5 pages.

Lecocq et al., "Nonreciprocal Microwave Signal Processing with a Field-Programmable Josephson Amplifier," Physical Review Applied 7, 024028 (2017), 17 pages.

Ranzani et al., "Wideband Isolation by Frequency Conversion in a Josephson-Junction Transmission Line," Physical Review Applied 8, 054035 (2017), 7 pages.

Chapman et al., "Widely Tunable On-Chip Microwave Circulator for Superconducting Quantum Circuits," Physical Review X 7, 041043 (2017), 16 pages.

Lecocq et al., "Microwave Measurement beyond the Quantum Limit with a Nonreciprocal Amplifier," Physical Review Applied 13, 044005 (2020), 12 pages.

* cited by examiner

QUANTUM CIRCUIT WITH JOSEPHSON MULTIPOLE ISOLATOR

BACKGROUND

One or more embodiments described herein relate to a superconducting circuit device for a quantum system, in which the superconducting circuit device can provide microwave isolation between components of the quantum system, and a corresponding method of fabrication and method of use. More particularly, the one or more embodiments described herein relate to an isolator circuit device and system, such as can be employed in a qubit measurement circuit, having a bandpass filter configuration for generating non-reciprocal signal transmission between ports of the isolator circuit device. The non-reciprocal signal transmission can take the form of isolation, frequency conversion and/or directional amplification.

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in some cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Physical, real-world, quantum logic circuits controlled by a quantum system can include a plurality of qubits. One type of qubit, a superconducting qubit, can include a Josephson junction, and operates generally only within a cryogenic chamber, such as a dilution refrigerator. One or more such superconducting qubits can be multiplexed per measurement circuit contained within the cryogenic chamber.

SUMMARY

The following presents a summary to provide a basic understanding of one or more embodiments described herein. This summary is not intended to identify key or critical elements, or to delineate any scope of the particular embodiments and/or any scope of the claims. The sole purpose of the summary is to present concepts in a simplified form as a prelude to the more detailed description that is presented later. In one or more embodiments described herein, devices, systems, apparatuses, methods, computer-implemented methods and/or computer program products are described that can facilitate isolation imposed between a quantum processor and a respective qubit measurement circuit and/or which respective qubit measurement circuit can have a small footprint, such as within a respective cryogenic chamber of a quantum system.

According to an embodiment, a device can comprise an isolator circuit having a bandpass filter configuration coupled between a pair of ports and the bandpass filter configuration comprising two or more poles.

According to another embodiment, a method can comprise facilitating asymmetric RF transmission relative to a signal from a quantum chip of a quantum computer by coupling an isolator device to the quantum chip and the isolator device comprising an isolator circuit having two ports and a bandpass filter configuration coupled between the two ports, wherein the bandpass filter configuration comprises two or more poles.

According to yet another embodiment, a system can comprise a processor, a quantum chip controlled by the processor, and an isolator device coupled to the quantum chip and comprising an isolator circuit having two ports and a bandpass filter configuration coupled between the two ports, wherein the bandpass filter configuration comprises two or more poles.

An advantage of such devices, systems and/or methods can be that the device can be employed as at least a portion of a readout circuit, such as being an isolation circuit device, relative to one or more superconducting qubits of a quantum system. The reduced overall size of the device can allow for increased quantity of such devices to be employed relative to a common overall footprint, such as within a cryogenic chamber. This reduced size can make up for one or more deficiencies of existing technologies that can look to increase number of qubits within a cryogenic chamber, increase processor size and/or multiplex an increased number of qubits per measurement circuit (e.g., line). Indeed, due to reduced footprint as compared to a ferrite-based isolator and associated shielding, the circuit structures of a device described herein can feasibly be constructed on a circuit chip, thus significantly reducing a footprint of a readout circuit as compared to existing techniques.

Another advantage of such device, system and/or method can be isolation of not only a qubit frequency, thus limiting noise at such frequency that can undesirably put a qubit into a non-computational state, but also can enable isolation at one or more of the resonant frequencies of the qubit readout resonators, thus limiting population of the circuit with noise photons. In this way, coherence at a qubit circuit employing the features in combination (e.g., multiplexed) with one or more physical qubit devices can be improved, as compared to existing techniques. The isolation can be realized over a wide frequency band, having a range larger than about 500 megahertz (MHz), such as in a range of about 500 MHz to about 1000 MHz.

In one or more embodiments of the above devices, systems and/or methods, such device further can comprise two or more shunt resonators, wherein the two or more shunt resonators are coupled together with one or more admittance inverters. An advantage of such device, system and/or method can be the nonlinearity of the inductive components of the device. For example, the poles can each be realized via a shunt resonator, such as resonator having passive circuit elements of an inductor (L) and a capacitor (C) connected together (e.g., also referred to herein as a parallel LC resonator), with the inductance of the resonators each comprising a direct current (DC) superconducting quantum interference device (SQUID). The DC SQUIDs can provide non-linear inductance. This nonlinearity can allow for mixing between the signal and pump frequencies, such as 3 or 4 wave mixing.

In one or more embodiments of the above devices, systems and/or methods, such device further can comprise two or more LC resonators each comprising a pair of Josephson junctions employed in parallel, and mutually coupled flux bias control lines located in proximity to the pairs of Josephson junctions. An advantage of such device and/or method can be nonlinearity of inductance components of the device. For example, the poles can each be realized by a shunt resonator, such as an LC resonator, each comprising a DC superconducting quantum interference device (SQUID). The DC SQUIDs can provide non-linear inductance, which can allow for 3 or 4 wave mixing.

Another advantage of such device, system and/or method can be dynamic adjustment of the RF flux pump tone at the two or more poles of such device, allowing non-reciprocal signal transmission to be generated between the poles, resulting in isolation, frequency conversion and/or directional amplification. Dynamic control of pump amplitude, frequency and/or phase variables can allow for dynamic bandwidth of reverse or forward travelling power. Also, in one or more embodiments, directional isolation can be achieved that is better than about 10 dB to about 20 dB.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
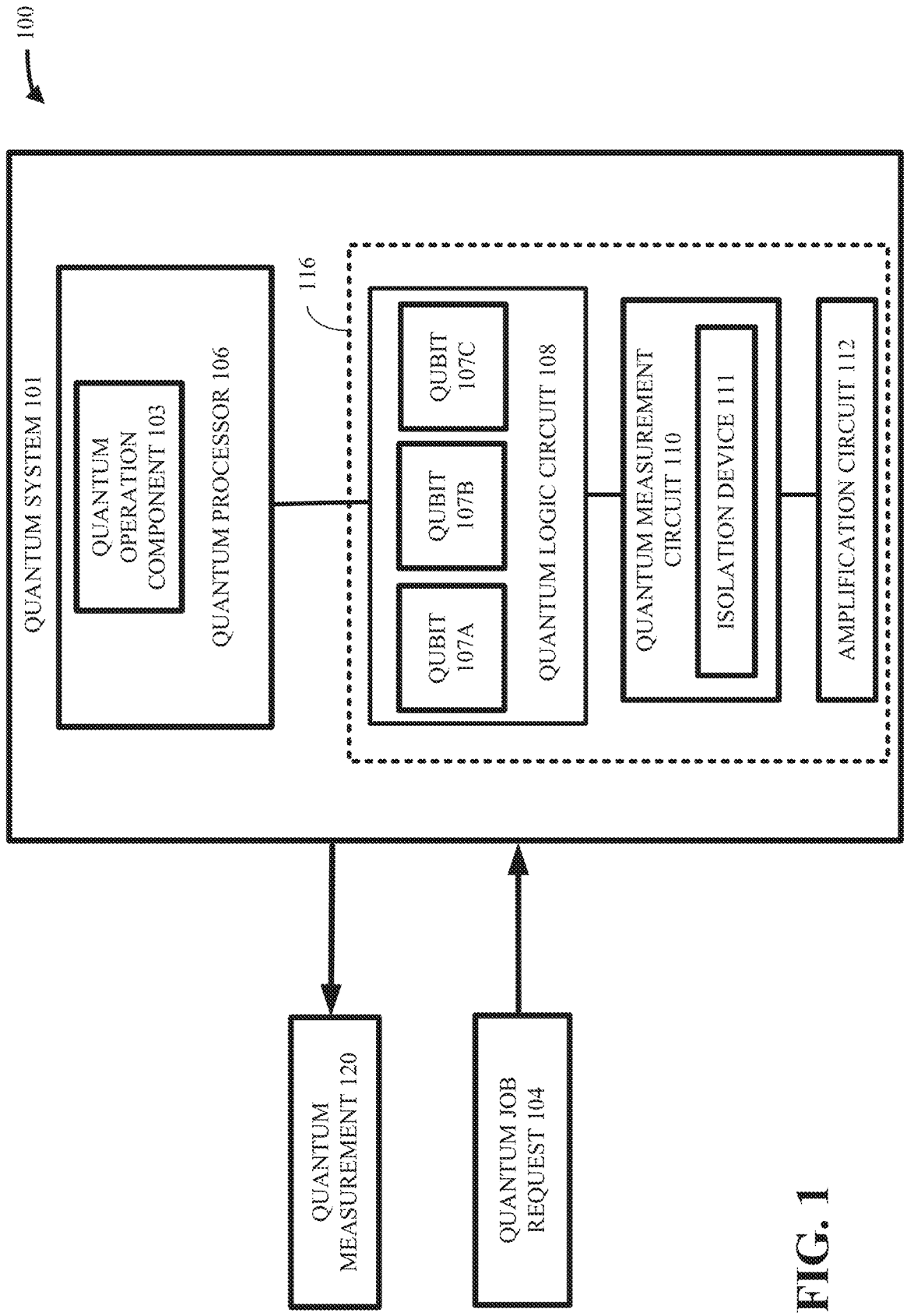
FIG. 1 illustrates a block diagram of an example, non-limiting system that can facilitate operation of one or more qubits, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in this Detailed Description section.

Information processed by qubits can be emitted in the form of microwave energy in a range of microwave frequencies. The microwave emissions can be captured, processed and/or analyzed to decipher the quantum information encoded therein. For quantum computing of qubits to be reliable, deleterious backaction effects on quantum circuits, e.g., the qubits themselves, the readout circuitry associated with the qubits, and/or other types of superconducting quantum logic circuits, should be limited and/or prevented. This operational constraint on any circuit that operates to enable readout of quantum information can thus call for special consideration in fabricating structures, such as isolator devices, that are used in such circuits. Generally, limitations relative to this operational constraint can result in undesired noise and or qubit decoherences, and thus less efficient, slow and/or more costly execution of quantum jobs.

For example, in existing technologies, readout electronics of such measurement circuitry can produce undesired backaction on one or more of the qubits multiplexed with the readout electronics. This backaction can include low frequency noise and/or qubit frequency noise, which can effect accuracy, precision and/or efficiency of measurement from the respective qubits, and which can cause readout errors. The affected readout can be due to weakening of a readout signal, disturbance to the readout signal and/or one or more decoherence effects on the qubits.

In existing technologies, a ferrite-based isolator can be employed in a superconducting quantum system between the quantum processor and an amplifier of a measurement circuit (also herein referred to as a readout circuit) in attempt to reduce deleterious backaction. Such ferrite-based isolator typically is large, bulky and/or expensive. Further, the circuits employing the ferrite-based isolators can necessitate significant shielding, such as to limit and/or prevent magnetic field leakage from the ferrite-based isolators. That is, employing plural ferrite-based isolators and associated shielding in a cryogenic chamber relative to plural readout lines can consume a large footprint within the cryogenic chamber, and have a high cost. Relative to scaling of quantum systems to include larger quantum processors and increased qubit counts, such large and expensive ferrite-based isolators can be a concern limiting such increases. These limitations can limit and/or prevent construction of quantum systems employing large numbers of qubits, and particularly superconducting qubits.

Also on a large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that increased and/or efficient performance can be extracted from near-term error-prone systems and/or so that a quality of measurements relative to the one or more qubits of the respective quantum systems compiling into physical-level pulses can be improved (e.g., related to accuracy, precision and/or measurement efficiency).

In view of the aforementioned one or more problems with current approaches and or devices employed in quantum systems, and particularly relative to qubit measurement, it can be desired to improve upon size reduction and/or noise isolation within such devices. To that end, the described subject matter can employ various techniques that can improve (e g, enhance, optimize and/or increase) the quality of measurement of such quantum jobs, and as an effect can improve (e.g., enhance and/or optimize) execution of such quantum jobs in one or more embodiments. In one or more cases, the one or more embodiments described herein can allow for increased scaling of execution of the associated quantum programs implementing quantum circuits, such as due to increased scaling (e.g., plural numbers of device) of one or more devices described herein and/or qubits employed. Indeed, due to reduced footprint as compared to a ferrite-based isolator and associated shielding, the circuit structures of a device described herein can feasibly be constructed at a circuit chip scale, thus significantly reducing a footprint of a readout circuit as compared to existing techniques.

An isolator device as described herein, in the one or more embodiments below, can be employed as at least a portion of a readout circuit, such as being an isolation circuit device, relative to one or more superconducting qubits of a quantum system. The device can comprise a bandpass filter configuration coupled between a pair of ports, with the bandpass filter configuration comprising two or more poles. The poles can each be realized via a shunt resonator, such as a LC resonator, and each comprising a DC superconducting quantum interference device (SQUID). The DC SQUIDs provide non-linear inductance, which can allow for mixing between the pump and signal frequencies, such as 3 or 4 wave mixing.

This mixing can be dependent at least in part on control of flux bias lines of the device. That is, mutually coupled flux bias control lines can be employed in proximity to each DC SQUID to facilitate single-ended or RF flux pumping (e.g., biasing) at the different poles. In this way, the flux biasing can be employed at the two or more poles, allowing non-reciprocal signal transmission to be generated between the poles, such as including directional isolation, directional amplification and/or frequency conversion. That is, dependent upon control of the flux bias control lines, via altering pump amplitude, DC offset, frequency, and/or phase, a device described herein can effectively replace both an isolator chain and amplifier chain of an existing measurement circuit. Dynamic control of these variables can allow for dynamic bandwidth of reverse or forward travelling power. Also, in one or more embodiments, directional isolation can be achieved that is better than about 10 decibels (dB) or even about 20 dB.

These features together generally can provide a two-port lumped element circuit with Josephson junction devices, such as employing ten or fewer Josephson junction devices when employing five or fewer parallelly aligned poles in the isolation circuit device. Furthermore, the aforementioned features can function within a cryogenic space, such as that of a dilution refrigerator. That is, the topology of a device described herein, as compared to existing devices, is modified and/or constructed to function at temperatures of about 4K and below.

These features also can enable isolation of not only a qubit frequency, thus limiting noise at such frequency that can undesirably put a qubit into a non-computational state, but also can enable isolation of one or more readout frequencies, thus limiting population of noise photons in the circuit. In this way, coherence of a qubit circuit employing the features in combination (e.g., multiplexed) with one or more physical qubit devices can be improved, such as prolonged, as compared to existing techniques. The frequency isolations can be realized over a wide band, such having a range of about 500 MHz to about 1000 MHz.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance execution of a quantum job, such as by enhancing quantum measurement relative to the quantum job.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, a quantum logic circuit 108 comprising one or more qubits (e.g., qubits 107A, 107B and/or 107C), also referred to herein as qubit devices 107A, 107B and 107C, a quantum measurement circuit 110 and an amplification circuit 112.

The quantum processor 106 can be any suitable processor. The quantum processor 106 can generate one or more instructions for controlling the one or more processes of the quantum operation component 103 and/or for controlling the quantum logic circuit 108, quantum measurement circuit 110 and/or amplification circuit 112.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 110, for executing the quantum program. The request 104 can be provided in any suitable format, such as a text format, binary format and/or another suitable format. In one or more embodiments, the request 104 can be received by a component other than a component of the quantum system 101, such as by a component of a classical system coupled to and/or in communication with the quantum system 101.

The quantum operation component 103 can perform one or more quantum processes, calculations and/or measurements for operating one or more quantum circuits on the one or more qubits 107A, 107B and/or 107C. For example, the quantum operation component 103 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the quantum operation component 103 and/or the quantum processor 106, can execute operation of a quantum logic circuit on one or more qubits of the circuit (e.g., qubit 107A, 107B and/or 107C). The quantum operation component 103 can output one or more quantum job results, such as one or more quantum measurements 120, in response to the quantum job request 104.

The quantum logic circuit 108, quantum measurement circuit 110 and/or amplification circuit 112 can be contained in a cryogenic environment, such as an environment generated by a cryogenic chamber 116, such as a dilution refrigerator. Where qubits 107A, 107B and 107C are superconducting qubits, cryogenic temperatures, such as about 4 Kelvin (K) or lower, can be employed to facilitate function of these physical qubits. Accordingly, the elements of the quantum measurement circuit 110 also are to be constructed to perform at such cryogenic temperatures.

The quantum measurement circuit 110 can be multiplexed to one or more qubits, such as to about five qubits and/or to about three qubits, such as the qubits of the quantum logic circuit 108. The quantum measurement circuit 110 can generally provide microwave isolation between cryogenic components in the cryogenic chamber 116 and/or between the cryogenic components and the quantum processor 106. As illustrated, the quantum measurement circuit 110 can comprise an isolator device 111 in accordance with one or more embodiments described herein, such as with reference to FIGS. 2 and/or 3. Generally, construction of and/or elements employed in the isolator device 111 can benefit size reduction and/or noise isolation within such devices, such as compared to existing devices, such as ferrite-based isolators.

The amplification circuit 112 can be coupled to the quantum measurement circuit 110. In one or more embodiments, the amplification circuit 112, such as including any suitable amplification component, can generally provide amplification of a weak quantum readout signal, enhancing readout outside of the cryogenic chamber 116. In one or more embodiments, the amplification circuit 112 can be disposed external to the cryogenic chamber 116 for receiving a measurement signal from within the cryogenic chamber 116. In one or more embodiments, as described below, the isolator device 111 can feasibly provide amplification function and thus the amplification circuit 112 can be omitted relative to one or more quantum logic circuits of qubits of a quantum system.

The following/aforementioned description(s) refer(s) to the operation of a single quantum program from a single quantum job request. However, one or more of the processes described herein can be scalable, such as execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
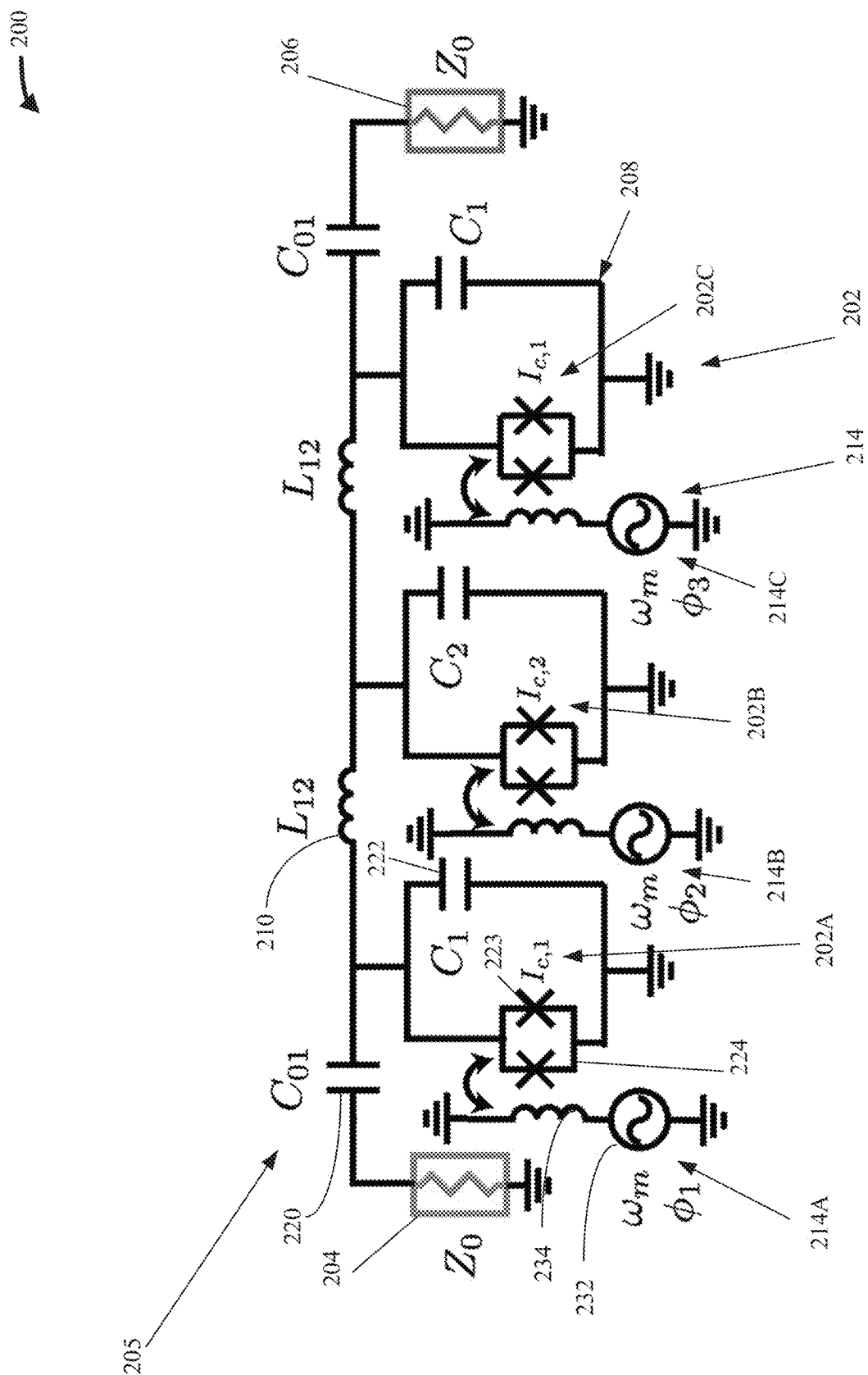
FIG. 2 illustrates a schematic diagram of a device, in accordance with one or more embodiments described herein.

Turning now to FIG. 2, a device 200, such as an isolator device 200 is illustrated schematically. The device 200 can be employed as the isolator device 111 of the non-limiting system 100 of FIG. 1. In one or more embodiments, the device 200 can be employed as both the isolator device 111 and can provide function of the amplification circuit 112, allowing for omission of the amplification circuit 112.

Generally, the device 200, like the isolator device 111, can improve upon size reduction and/or noise isolation within such devices compared to existing devices, such as ferrite-based isolators. As shown, the device 200 can comprise a pair of ports 204 and 206, and a bandpass filter configuration coupled between the two ports 204 and 206. The bandpass filter configuration, generally shown at 205, can include two or more poles 202, realized by shunt resonators 208, admittance inverters 210 and 220, capacitors 222 (e.g., of the shunt resonators 208) and flux bias control lines 214, such as providing a lumped element circuit.

Generally, the device 200 can be a two-port circuit, such as including and/or being disposed between a pair of ports including port-1 at 204 and port-2 at 206. At least a pair of poles 202 are disposed in the circuit between the ports 204 and 206. As shown, three poles 202A, 202B and 202C are included. In other embodiments, two poles, four poles and/or five poles can be included. Including four or more poles can lead to diminishing returns due to a bandwidth achievable with four or more poles. For example, two poles can be provided to define the bandwidth of the underlying bandpass filter. Additional poles beyond two can define said region more sharply in frequency space but generally do not increase the bandwidth. In addition, additional poles can employ more radio frequency (RF) pump controls which can increase complexity of the overall circuit.

At the illustrated embodiment, at the poles 202A, 202B and 202C, shunt resonators 208 can be disposed in proximity to flux bias control lines 214. The shunt resonators 208 at the poles 202A-C can be coupled together via admittance inverters 210. That is, an admittance inverter 210 is disposed between each pair of adjacent poles 202A-C. The admittance inverters 210 can be realized via capacitors, inductors and/or transmission-lines. For example at FIG. 2, the admittance inverters 210 are realized as inductors $L_{12}$ and $L_{21}$.

In addition, further circuit structures 220, such as admittance inverters, such as capacitors, can be employed in the circuit between the ports 204 and 206 and the poles 202 most adjacent to the ports 204 and 206. For example, at FIG. 2, one capacitor $C_{01}$ is disposed between the pole 202A and the port-1 ($Z_0$) 204. Another capacitor $C_{01}$ is disposed between the pole 202C and the port-2 ($Z_0$) 206.

The shunt resonators 208 can be implemented as LC resonators each having a capacitor 222 coupled in parallel to a SQUID, such as a DC SQUID 224. The DC SQUIDs 224 each comprise a pair of Josephson junctions 223 coupled in parallel to one another. In one or more embodiments, an inductor (not shown) can be coupled in series with a DC SQUID 224 at one or more poles opposite the respective capacitor 222.

The flux bias control lines 214 each can comprise a respective current pump 232 coupled in line with a respective inductor 234. The flux bias control lines 214 can be mutually biased relative to one another. One flux bias control line 214 can be disposed in proximity to each shunt resonator 208, and more particularly in proximity to each DC SQUID 224. In this way, the inductance of each DC SQUID 224 can be AC modulated by the flux bias, such as at a frequency $F_m$, where $F_m$ is a modulation frequency. The modulation can displace energy into sidebands (not shown) at frequencies $F_0+/-n(F_m)$, where $F_0$ is the signal frequency and n is any suitable integer. As a result, relative to dynamic control of one or more variables at the flux bias control lines 214, bandwidth of microwave isolation provided between the ports 204 and 206 can be varied dynamically. For example, in a case where the flux bias is AC only, the mixing is 4 wave and n can only be an even integer. In a case where a DC component of flux is added in conjunction with an AC flux bias, the mixing is 3 wave and n can be any integer, even or odd.

Accordingly, in one or more cases, variables at the flux bias control lines 214, such as phase, pump amplitude, pump frequency and/or DC Flux offset, can be varied. The varying can be relative to one another. The varying can be dynamic, such as during use of one or more qubits coupled (e.g., multiplexed) to the respective device 200. That is, the isolator device 200 can provide active control, rather than passive control, of microwave isolation between the ports 204 and 206.

Indeed, depending on the relative phases and/or amplitudes of the modulation signals at the SQUID 224/flux bias control line 214 interface, energy dispersed into the sidebands 230 can be controlled by the isolator device 200. In one or more embodiments, the phase, DC Offset and/or amplitude of the flux bias control lines 214 can be controlled by the processor 106, when employed in the non-limiting system 100. The phases, DC offsets and/or pump amplitudes of the various flux bias control lines 214 can be selectively controlled, such as by an entity administering a respective quantum program at a respective quantum system. The flux pump amplitude, offset, frequency and/or phases are parameters that can be tuned to achieve microwave isolation. That is, if a pump tone of one or more current pumps 232 are off, the non-reciprocal properties provided by the device 200, such as directional amplification, frequency conversion and/or gain, can be no-longer realized. That is, fully symmetric operation ($S_{21}=S_{12}$) can be restored, which can be undesirable in one or more situations of operation of a respective quantum circuit ($S_{21}$ being the power delivered at port-2 as applied as reference to port-1, and $S_{12}$ being the power delivered at port-1 as applied as reference to port-2).

In one example, the phases $\Phi_1/\Phi_2/\Phi_3$ at flux bias control lines 214A/214B/214C can each be different at different points in time of a quantum execution where the phases are dynamically controlled (e.g., including being separately dynamically controlled).

As shown, the pump frequencies aim of the current pumps 232 of the flux bias control lines 214 each are equal. In one or more other embodiments, the pump frequencies of one or more different flux bias control lines 214 can be different from one another.

In view of the control of energy dispersed into the sidebands, a non-reciprocal signal transmission can be generated by the isolator device 200 between the ports 204 and 206. The non-reciprocal signal transmission can take the form of isolation, such as directional isolation, amplification, such as directional amplification, frequency conversion and/or gain. That is, the isolator circuit provided by the isolator device 200 can be modulated to achieve both isolation and directional amplification. Indeed, in one embodiment, depending on particular values of structures employed in the device 200, in accordance with the aforementioned description, the device 200 can provide both directional isolation of qubit and/or resonator frequencies and directional amplification of a signal produced by one or more qubits multiplexed to the device 200.

In one example relative to FIG. 2, a signal at $F_0$ travelling from port-1 204 to port-2 206 can travel without losing, and/or with losing minimal, energy to the modulated sidebands when the signal reaches port 2. However, a signal travelling from port-2 206 to port-1 204 can undergo frequency conversion, and the resulting signal at port-1 204 can have energy in one or more sidebands 230, but no energy in $F_0$.

In one or more embodiments, $\Phi_1$ can be about 0 deg to about 45 degrees, $\Phi_2$ can be about 45 deg to about 90 degrees, and $\Phi_3$ can be about 45 deg to about 180 deg. In one or more other embodiments, $\Phi 1$ can be about 0 deg to about 25 degrees, $\Phi 2$ can be about 30 deg to about 90 degrees, and $\Phi 3$ can be about 80 deg to about 180 deg. Direction of power flow at the isolator device 200 can be reversed by changing, e.g., reversing, the values of $\Phi_1$, $\Phi_2$ and $\Phi_3$. That is, one set of values of $\Phi_1$, $\Phi_2$, and $\Phi_3$ can provide unity transmission in a direction of power flowing from port 206 to port 204 ($S_{21}$) and isolation in a direction of power flowing from port 204 to port 206 ($S_{12}$). Alternatively, reversing the values such that $\Phi_{1rev}=\Phi_3$, $\Phi_{2rev}=\Phi_2$ deg, and $\Phi_{3rev}=\Phi_1$ deg can provide unity transmission in $S_{12}$ and isolation in $S_{21}$.

Figure 3:
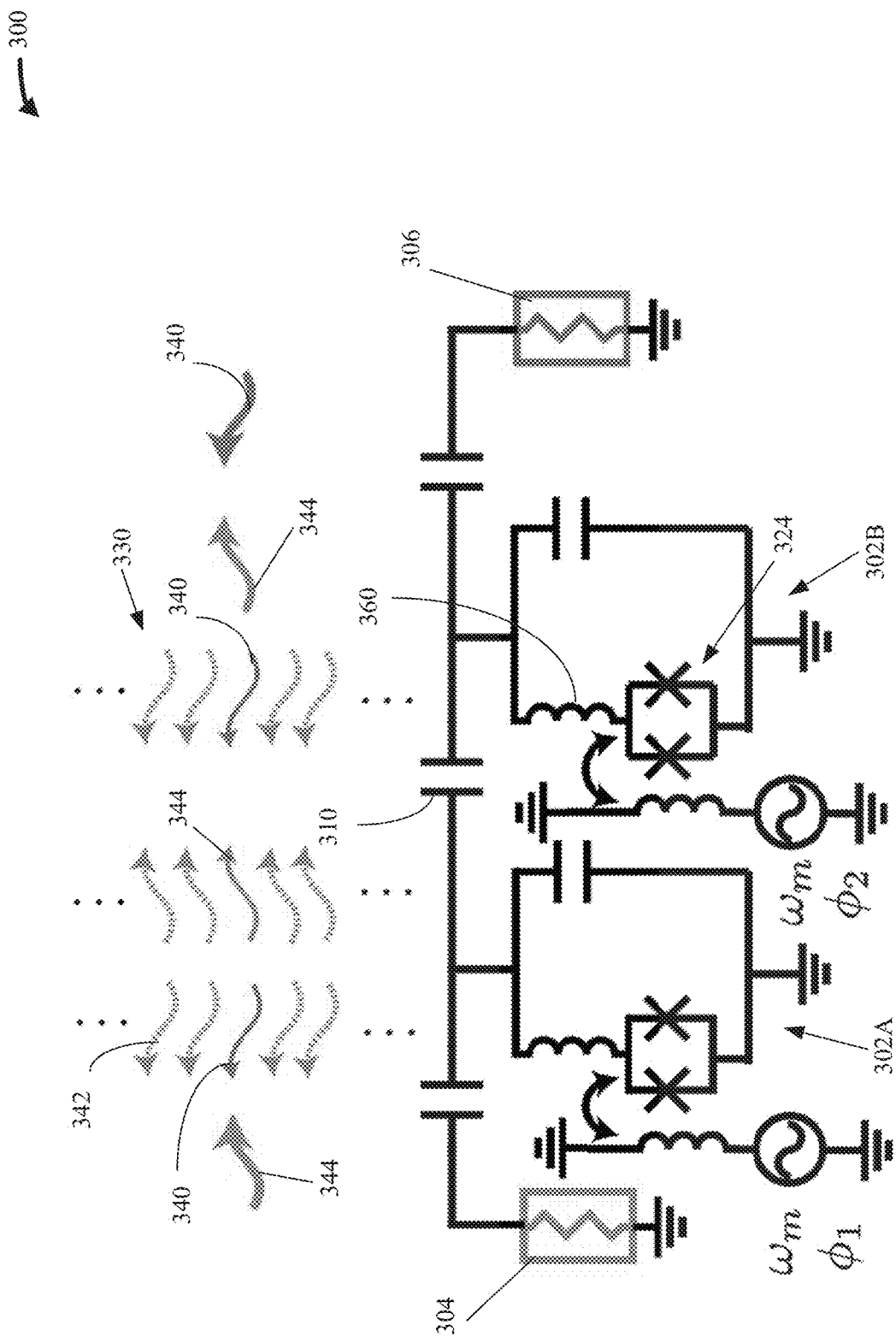
FIG. 3 illustrates a schematic diagram of another device, in accordance with one or more embodiments described herein.

Turning now briefly to FIG. 3, a device 300, such as an isolator device, is illustrated similar to the device 200 of FIG. 2. Accordingly, repetitive description of like elements and/or processes employed in respective embodiments is omitted for sake of brevity. Different from the device 200, the device 300 comprises only a pair of poles 302A and 302B.

FIG. 3 illustrates a two-pole isolator device 300 having an inductor 360 in series with each DC SQUID 324. A capacitor 362 can serve as an admittance inverter coupling the poles 302A and 302B to one another. In one example, $\Phi_1$ can be about 0 deg to about 70 deg and $\Phi_2$ can be about 30 deg to about 80 deg. In another example, $\Phi_1$ can be about 0 deg to about 45 deg and $\Phi_2$ can be about 45 deg to about 90 deg.

Further FIG. 3 also illustrates sidebands 330. Sidebands 330 are provided to illustrate that where signal power flows from port 306 to port 304, power that starts initially at arrows 340 is accordingly dispersed in the dashed sidebands 330 via mixing at the pole 302B and further dispersed in sidebands 342 via mixing at the pole 302A, in view of the construction of the isolator device 300. That is, the energy at the frequency represented by the arrows 340 is dispersed into many different frequencies and is isolated. Differently, where signal power flows from port 304 to port 306, power that begins in arrows 344 is initially dispersed into the sidebands 342 by mixing at the pole 302A, but then can be reconcentrated back into sidebands 344 by further mixing at the pole 302B, relative to generally pure directionality of the frequency 344 (e.g., unity transmission).

Figure 4:
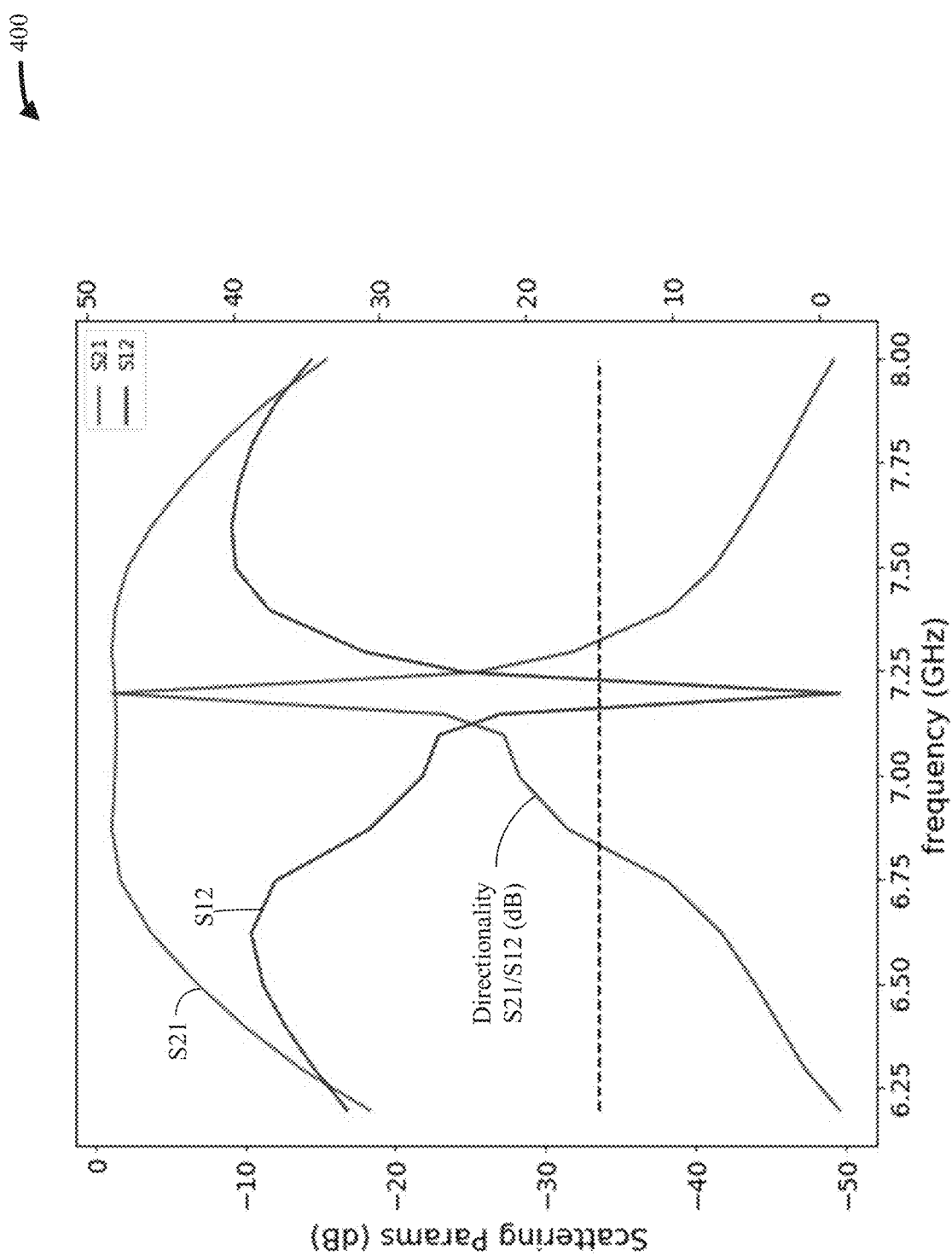
FIG. 4 illustrates a graph displaying frequency relative to directionality, relative to employment of the device of FIG. 2, in accordance with one or more embodiments described herein.

Turning next to FIG. 4, a graph 400 is illustrated graphing simulated scattering parameters $S_{21}$ and $S_{12}$ in dB as a function of Frequency in GHz relative to the device 200. Non-reciprocal signal transmission between ports 1 and 2 (S12=1=S21) can be clearly seen over a wide band of frequencies. Maximum isolation is seen at a frequency of about 7.2 GHz with better than 60 dB of directionality (|S21/S12|).

Figure 5:
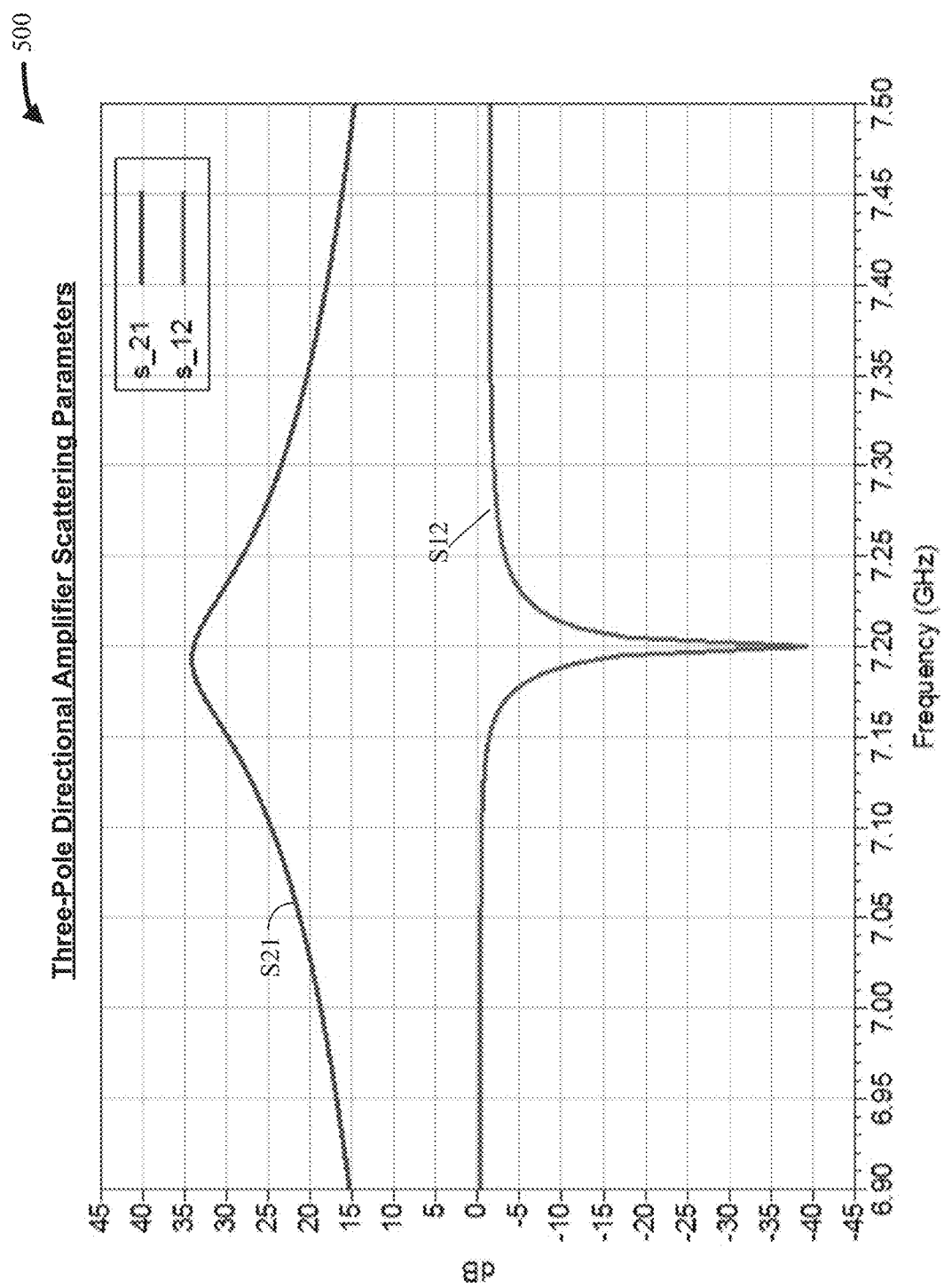
FIG. 5 illustrates a graph displaying signal frequency relative to gain, relative to employment of the device of FIG. 2, in accordance with one or more embodiments described herein.

Turning next to FIG. 5, a graph 500 is illustrated graphing simulated scattering parameters $S_{21}$ and $S_{12}$ as a function of signal frequency relative to the device 200. Shown is performance of the device in directional amplification mode.

Figure 6:
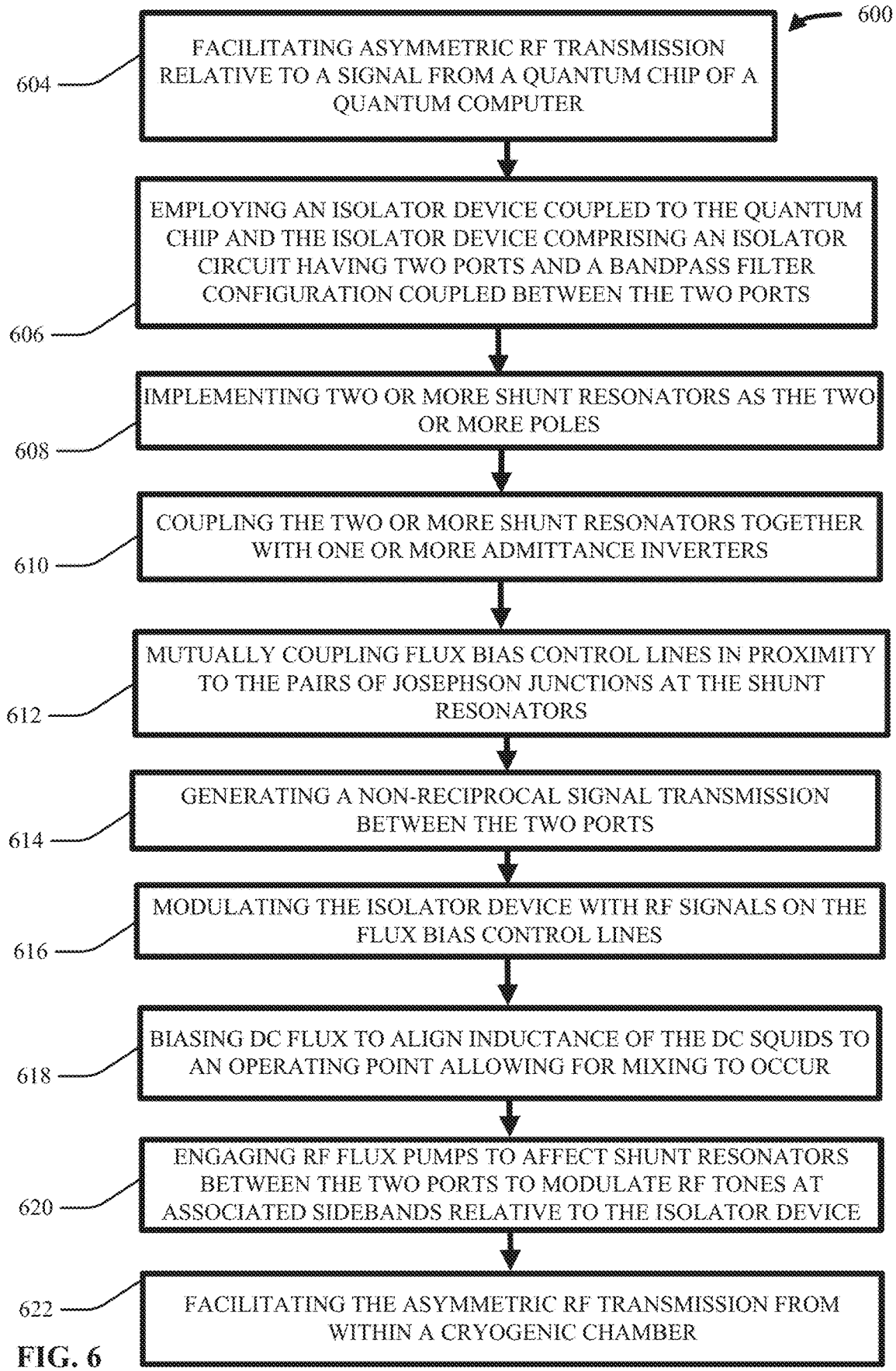
FIG. 6 illustrates a flow diagram of an example, non-limiting method that can facilitate a process to use a device, in accordance with one or more embodiments described herein.

Referring now to FIG. 6, this figure illustrates a flow diagram of an example, non-limiting method 600 that can facilitate a process to use a device constructed in accordance with one or more embodiments described herein such as the device 200 of FIG. 2, such as relative to a non-limiting system, such as the non-limiting system 100 of FIG. 1. While the method 600 is described relative to the device 200 of FIG. 2, the method 600 can be applicable also to other devices described herein, such as the device 300 of FIG. 3 and/or the isolator device 111 of FIG. 1. Repetitive description of like elements and/or processes employed in respective embodiments is omitted for sake of brevity.

Looking first to 604 at FIG. 6, the method 600 can comprise facilitating asymmetric RF transmission relative to a signal from a quantum chip of a quantum computer (e.g., non-limiting system 100).

At 606, the method 600 can comprise employing an isolator device (e.g., device 200) coupled to the quantum chip and comprising an isolator circuit having two ports (e.g., ports 204, 206) and a bandpass filter configuration coupled between the two ports (e.g., ports 204, 206).

At 608, the method 600 can comprise implementing two or more shunt resonators (e.g., shunt resonators 208) as the two or more poles (e.g., poles 202A, 202B, 202C) of the device (e.g., device 200). This operation can comprise implementing two or more LC resonators (e.g., as shunt resonators 208) each comprising a pair of Josephson junctions (e.g., Josephson junctions 223) employed in parallel.

At 610, the method 600 can comprise coupling the two or more shunt resonators (e.g., shunt resonators 208) together with one or more admittance inverters (e.g., admittance inverters 210).

At 612, the method 600 can comprise mutually coupling flux bias control lines (e.g., flux bias control lines 214) in proximity to pairs of Josephson junctions (e.g., Josephson junctions 223) at the shunt resonators (e.g., shunt resonators 208).

At 614, the method 600 can comprise generating a non-reciprocal transmission between the two ports (e.g., ports 204, 206).

At 616, the method 600 can comprise modulating (e.g., via quantum processor 106 and/or other processor), the isolator device (e.g., device 200) with RF signals on the flux bias control lines (e.g., flux bias control lines 214A, 214B, 214C), such as to achieve both isolation and directional amplification.

At 618, the method 600 can comprise biasing (e.g., via quantum processor 106 and/or other processor), DC flux (e.g., at flux bias control lines 214) to align inductance of DC SQUIDs (e.g., DC SQUIDs 224) at each of the two or more poles (e.g., poles 302A, 302B, 302C) to an operation point allowing for mixing to occur, such as between the pump and signal frequencies, such as 3 or 4 wave mixing.

At 618, the method 600 can comprise biasing DC flux (e.g., at 214) of the DC SQUIDs (e.g., DC SQUIDs 224) with shunt inductance of the isolator device. In one or more embodiments, where no AC flux is applied, the isolator device can function as a reciprocal bandpass filter.

At 620, the method 600 can comprise engaging, by the system (e.g., via quantum processor 106 and/or other processor), RF flux pumps (e.g., pumps 232) to affect shunt resonators (e.g., shunt resonators 208) between the two ports (e.g., ports 204 and 206) to modulate RF tones at associated sidebands (e.g., sidebands 230) relative to the isolator device (e.g., device 200).

At 622, the method 600 can comprise transmitting the signal from within a cryogenic chamber (e.g., chamber 116).

Figure 7:
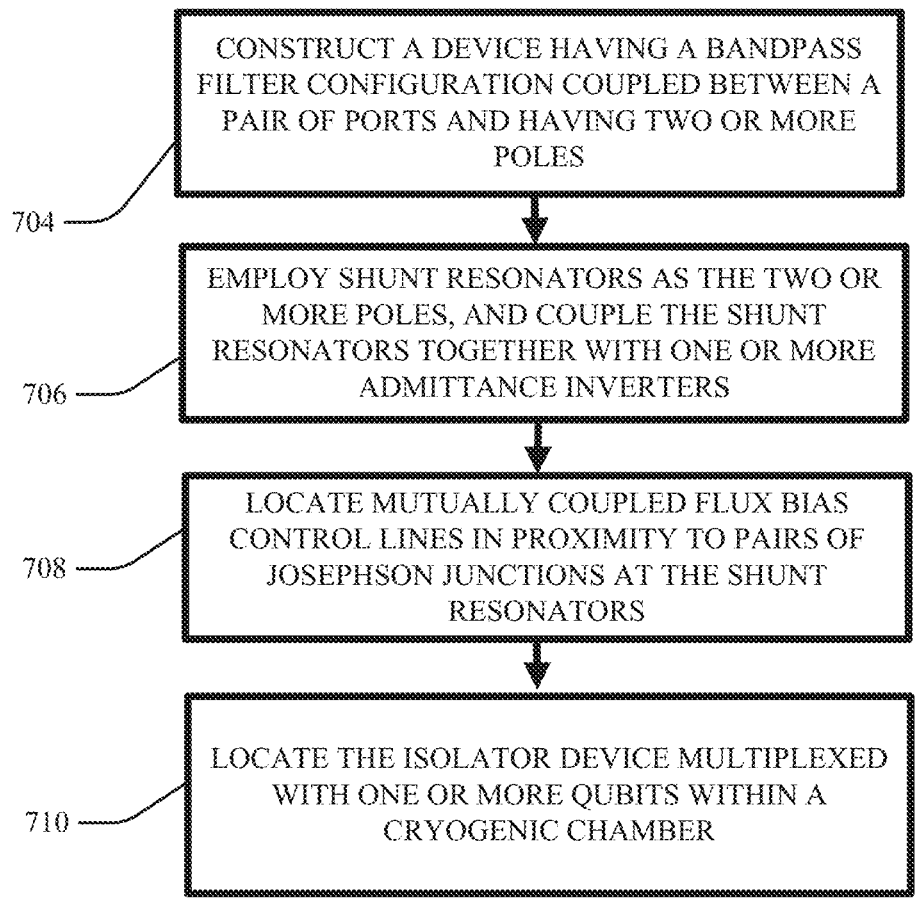
FIG. 7 illustrates a flow diagram of an example, non-limiting method that can facilitate a process to fabricate a device, in accordance with one or more embodiments described herein.

Next, FIG. 7 illustrates a flow diagram of an example, non-limiting method 700 that can facilitate a process to fabricate a device constructed in accordance with one or more embodiments described herein such as the device 200 of FIG. 2. While the method 700 is described relative to the device 200 of FIG. 2, the method 700 can be applicable also to other devices described herein, such as the device 300 of FIG. 3 and/or the isolator device 111 of FIG. 1. Repetitive description of like elements and/or processes employed in respective embodiments is omitted for sake of brevity.

At 704, the method 700 can comprise constructing an isolator device (e.g., device 200) having a bandpass filter configuration coupled between a pair of ports (e.g., ports 204, 206) and having two or more poles (e.g., poles 202A, 202B, 202C).

At 706, the method 700 can comprise employing shunt resonators (e.g., shunt resonators 208) as the two or more poles (e.g., ports 204, 206), and coupling the shunt resonators (e.g., 208) together with one or more admittance inverters (e.g., admittance inverters 310).

At 708, the method 700 can comprise locating mutually coupled flux bias control lines (e.g., flux bias control lines 214A, 214B, 214C) in proximity to pairs of Josephson junctions (e.g., Josephson junctions 223) at the shunt resonators (e.g., shunt resonators 208).

At 710, the method 700 can comprise locating the isolator device (e.g., device 200) multiplexed with one or more qubits (e.g., qubits 107A, 107B, 107C) within a cryogenic chamber (e.g., cryogenic chamber 116).

For simplicity of explanation, the computer-implemented and non-computer-implemented methodologies provided herein are depicted and/or described as a series of acts. It is to be understood and appreciated that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, those skilled in the art will understand and appreciate that the computer-implemented and non-computer-implemented methodologies could alternatively be represented as a series of interrelated states via a state diagram or events. Additionally, it should be further appreciated that the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices, methods of use and/or methods of fabrication provided herein relate to a device that can facilitate qubit measurement with isolation imposed between a quantum processor and a respective qubit measurement circuit and/or which respective qubit measurement circuit can have a small footprint, such as within a respective cryogenic chamber of a quantum system. According to one embodiment, a device comprises an isolator circuit having a bandpass filter configuration coupled between a pair of ports and the bandpass filter configuration comprising two or more poles. Two or more shunt resonators can be realized as the two or more poles, wherein the two or more shunt resonators can comprise DC SQUIDs and can be coupled together with one or more admittance inverters. A non-reciprocal signal transmission can be generated between the two ports by RF pumping the DC SQUIDs, which non-reciprocal signal transmission can take the form of isolation, frequency conversion and/or directional amplification.

An advantage of such isolator device can be that the device can be employed as at least a portion of a readout circuit, such as being an isolation circuit device, relative to one or more superconducting qubits of a quantum system. The reduced overall size of the device can allow for increased quantity of such devices to be employed relative to a common overall footprint, such as within a cryogenic chamber. This reduced size can make up for one or more deficiencies of existing technologies that can look to increase number of qubits within a cryogenic chamber, increase quantum processor size and/or multiplex an increased number of qubits per measurement circuit (e.g., line). Indeed, due to reduced footprint as compared to a ferrite-based isolator and associated shielding, the circuit structures of a device described herein can feasibly be constructed on a circuit chip, thus significantly reducing a footprint of a readout circuit as compared to existing techniques.

Another advantage of such device can be dynamic adjustment of differential flux biasing at the two or more poles of such device, allowing non-reciprocal signal transmission to be generated between the poles, such as comprising frequency conversion, directional isolation, directional amplification and/or gain. Dynamic control of pump amplitude, frequency, and/or phase variables can allow for dynamic bandwidth of reverse or forward travelling power. Also, in one or more embodiments, directional isolation can be achieved that is better than about 10 dB or even about 20 dB.

Another advantage of such device can be nonlinearity of inductance components of the device. For example, the poles can each comprise a shunt resonator, such as an LC resonator, each comprising a DC SQUID. The DC SQUIDs can provide non-linear inductance, which can allow for mixing between the pump and signal frequencies, such as 3 or 4 wave mixing.

Yet another advantage of such isolator device can be isolation of not only a qubit frequency, thus limiting noise at such frequency that can undesirably put a qubit into a non-computational state, but also can enable isolation of one or more qubit readout frequencies, thus limiting population of the circuit with noise photons. In this way, coherence at a qubit circuit employing the features in combination (e.g., multiplexed) with one or more physical qubit devices can be improved, such as prolonged, as compared to existing techniques. The frequency isolations can be realized over a wide band, such having a range of about 500 MHz to about 1000 MHz.

Indeed, in view of the one or more embodiments described herein, a practical application of the devices described herein is reduction in qubit circuit noise and/or increase in qubit coherency. This is a useful and practical application of quantum computers, especially in reduction of noise and/or other effects on reducing decoherence of employed qubits, and thus facilitating enhanced (e.g., improved and/or optimized) operation of the employed qubits. These enhancements can include increased accuracy of quantum results and/or increased availability of the employed qubits. Overall, such tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a quantum job request and can measure a qubit state of one or more qubits, such as superconducting qubits, of the quantum system. More particularly, regarding an isolator device described herein, and dependent upon control of the flux bias control lines of the device, such as via altering pump amplitude, DC offset, frequency, and/or phase, the device described herein can effectively replace both an isolator chain and amplifier chain of an existing measurement circuit.

Moreover, a device and/or method described herein can be implemented in one or more domains, such as quantum domains, to enable scaled quantum program executions. Indeed, use of a device as described herein can be scalable, such as where a device described herein can be multiplexed to one or more qubits of a multi-qubit system, reducing the footprint of the multiplexed circuit as compared to existing technologies. Thus increased scaling of qubits provided in a cryogenic chamber can be enabled. Further, in one or more embodiments, plural such devices can be coupled to one another within a cryogenic chamber, such as to provide a cascaded effect, such as differing levels of isolation. In such case, the plural devices in series can be implanted into a $Z_0$ impedance system.

The systems and/or devices have been and/or will be further described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to qubit measurement, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively increase accuracy of measurement and/or reduce deleterious backaction in a quantum readout circuit as the one or more embodiments described herein can facilitate this process. And, neither can the human mind nor a human with pen and paper electronically execute such measurement, reduction in deleterious backaction and/or related frequency isolation as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 8:
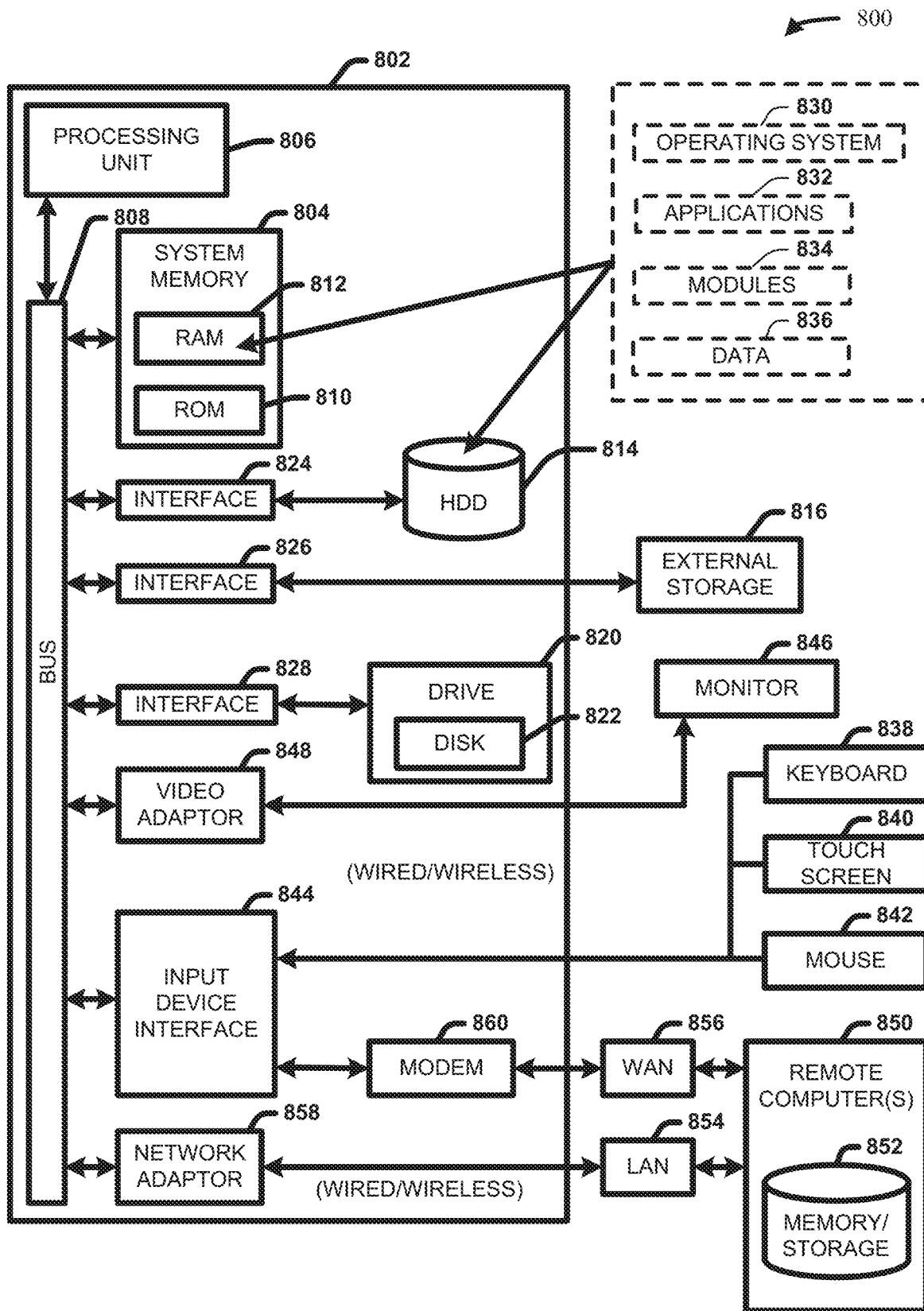
FIG. 8 illustrates a block diagram of an example, non-limiting operating environment in which one or more embodiments described herein can be facilitated.
Figure 9:
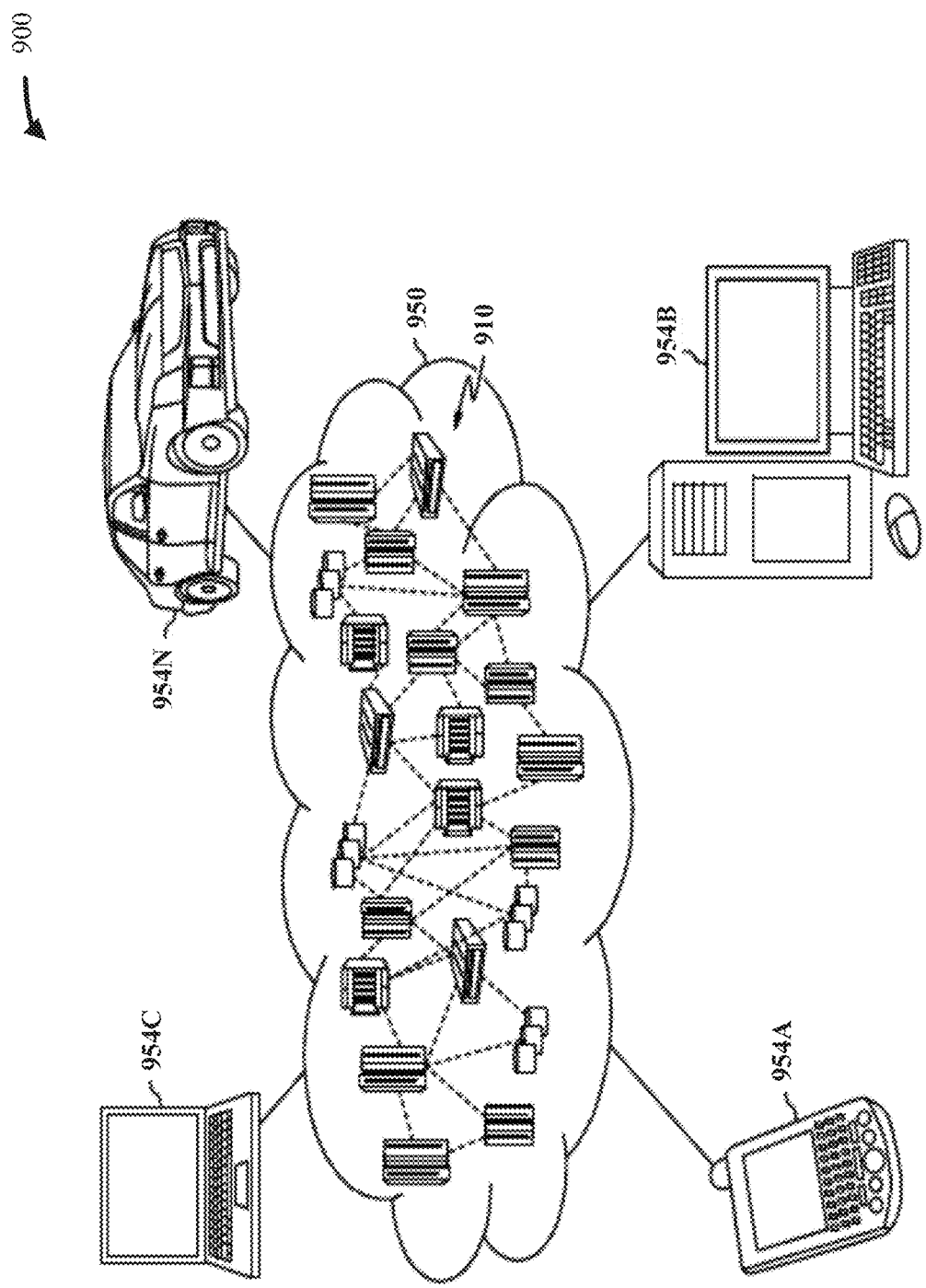
FIG. 9 illustrates a block diagram of an example, non-limiting cloud computing environment in accordance with one or more embodiments described herein.
Figure 10:
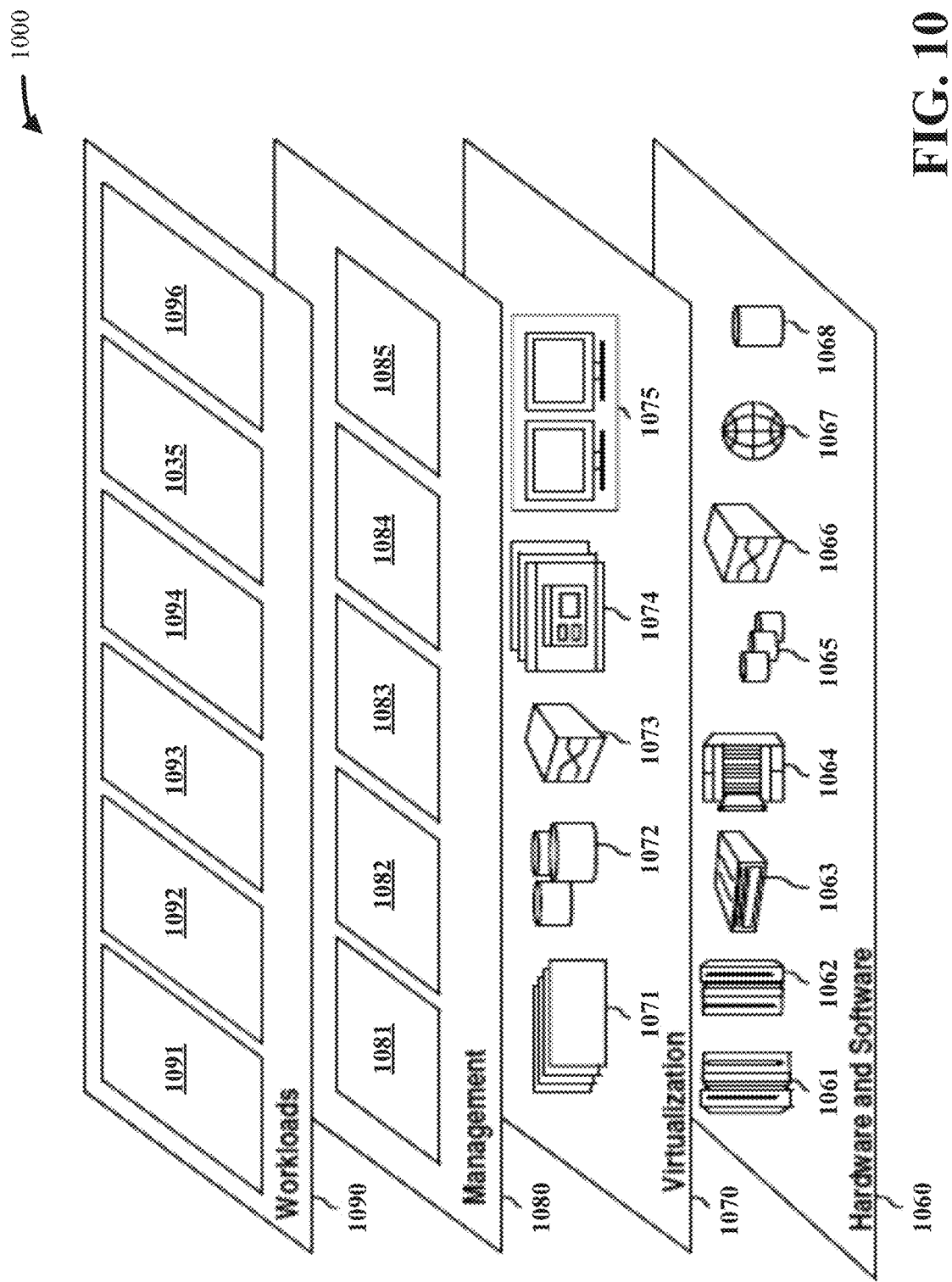
FIG. 10 illustrates a block diagram of a plurality of example, non-limiting abstraction model layers, in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the one or more methods described herein can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 106 of the non-limiting system 100. The processing unit 806 can be implemented in combination with and/or alternatively to processors such as 106.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, those skilled in the art will appreciate that the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," "data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A method, comprising:
facilitating asymmetric RF transmission relative to a signal from a quantum chip of a quantum computer by coupling an isolator device to the quantum chip and the isolator device comprising an isolator circuit having two ports and a bandpass filter configuration coupled between the two ports, wherein the bandpass filter configuration comprises two or more poles, wherein the two ports and the two or more poles are distinct elements and are not co-extensive with one another.

2. The method of claim 1, further comprising:
implementing two or more shunt resonators; and
coupling the two or more shunt resonators together with one or more admittance inverters.

3. The method of claim 1, further comprising:
implementing two or more LC resonators each comprising a pair of Josephson junctions employed in parallel; and
mutually coupling flux bias control lines in proximity to the pairs of Josephson junctions.

4. The method of claim 1, further comprising:
dynamically controlling a flux bias control line at each pole of the isolator circuit, wherein the respective flux bias control lines each are coupled to a DC SQUID.

5. The method of claim 1, further comprising:
modulating the isolator device to achieve both isolation and directional amplification.

6. The method of claim 4, further comprising:
biasing DC flux to align inductance of the DC SQUIDs to an operating point allowing for mixing to occur at the isolator device.

7. The method of claim 3, further comprising:
engaging RF flux pumps of the flux bias control lines to affect shunt resonators between the two ports to modulate RF tones at associated sidebands relative to the isolator device.

8. The method of claim 1, further comprising:
facilitating the asymmetric RF transmission from within a cryogenic chamber.

* * * * *